United States Patent [19]
MacDonald et al.

[11] Patent Number: 5,145,618
[45] Date of Patent: Sep. 8, 1992

[54] PROCESS FOR MANUFACTURING CONTINUOUS SUPPORTED ION SELECTIVE MEMBRANES USING NON-POLYMERIZABLE HIGH BOILING POINT SOLVENTS

[75] Inventors: Russell J. MacDonald, Watertown; Russell B. Hodgdon, Sudbury; Samuel S. Alexander, Concord, all of Mass.

[73] Assignee: Ionics, Incorporated, Watertown, Mass.

[21] Appl. No.: 571,478

[22] Filed: Aug. 23, 1990

Related U.S. Application Data

[63] Continuation-in-part of Ser. No. 404,939, Sep. 8, 1989, abandoned.

[51] Int. Cl.$^5$ .............................................. B01D 69/12
[52] U.S. Cl. .................................. 264/46.3; 264/46.2; 264/46.4; 264/146; 264/232; 264/340; 264/259; 156/77
[58] Field of Search ............. 264/46.2, 46.3, 46.5, 264/288.4, 146, 290.2, 46.4, 232, 340, 259; 156/552, 307.3, 544, 275.1, 272.2, 77; 425/110, 71

[56] References Cited

U.S. PATENT DOCUMENTS

| | | | |
|---|---|---|---|
| 2,483,014 | 9/1949 | Land et al. | 354/84 |
| 2,563,343 | 8/1951 | Land | 354/84 |
| 2,590,186 | 3/1952 | Land | 264/146 |
| 3,399,095 | 8/1968 | Hyland, Jr. | 264/46.3 |
| 4,324,606 | 4/1982 | Withers | 156/272.2 |
| 4,372,800 | 2/1983 | Oizumi et al. | 156/307.3 |
| 4,539,793 | 9/1985 | Malek | 156/275.1 |
| 4,601,861 | 7/1986 | Pricone et al. | 425/71 |
| 4,656,814 | 4/1987 | Lockington | 156/275.1 |

FOREIGN PATENT DOCUMENTS 62-92829  4/1987  Japan.

Primary Examiner—Hubert C. Lorin
Attorney, Agent, or Firm—Norman E. Saliba

[57] ABSTRACT

Processes for manufacturing in an environmentally friendly way, continuous, supported ion exchange membranes from (I) liquids containing vinyl and related monomeric electrolytes and high boiling solvents, the solvents also being swelling agents for the membranes; and (II) an indefinitely long, foraminous substrate.

11 Claims, 2 Drawing Sheets

PROCESS FOR MANUFACTURING CONTINUOUS SUPPORTED ION SELECTIVE MEMBRANES USING NON-POLYMERIZABLE HIGH BOILING POINT SOLVENTS

This application is a continuation-in-part of U.S. patent application Ser. No. 07/404,939 filed Sep. 8, 1989 now abandoned.

BACKGROUND OF THE INVENTION

1. Field of the Invention

The invention resides in the field of continuous processes for rapidly making supported ion exchange membranes from polymerizable liquid precursors having no non-polymerizable diluents (other than water) which have boiling points of less than about 185° C. and from quasi-continuous, foraminous, solid substrates such as fabrics, paper and microporous diaphragms and to the products of such processes.

2. Description of the Prior Art

During the last four decades several million square feet of ion exchange membrane have been made from freely flowing solutions of functional or functionizable monomers, crosslinking monomers and low molecular weight, non-polymerizing diluents for said monomers. (See e.g. U.S. Pat. No. 2,730,786). The diluents are also characterized by being good swelling agents for the polymers eventually resulting from such monomers and by being readily leached out of such polymers. Almost all of such membranes have been reinforced with substrates such as woven or non-woven fabrics, paper or microporous diaphragms. The process generally comprised interleaving the substrates and glass plates in a pool of such solution in shallow trays, removing excess solution, polymerizing the monomers by heating the array of plates and substrates for several hours and subsequently disassembling the array to retrieve the polymer impregnated substrates. The glass plates were generally recycled. In some few cases the polymer impregnated substrates were useful as ion exchange membranes after simple leaching in water (or other solvents and then water). Generally however functional monomers had first to be converted to suitable ion exchange groups (e.g. polyvinyl benzyl chloride-co-divinyl benzene to poly-(N-benzyl-N,N,N-trimethyl ammonium chloride)co-divinyl benzene) or ion exchange groups had to be added to functionizable moieties (e.g. sulfonic acid groups to polystyrene-co-divinyl benzene).

Such process, as is, is inherently labor intensive and difficult to automate or robotize. The non-polymerizing organic diluents generally used in the above mentioned solutions of monomers have had boiling points of less than about 185° C., e.g. methanol (65° C.), isopropanol (82° C.), dioxane (102° C.), isobutanol (108° C.), toluene (111° C.), diethyl benzene (183° C.). As a result substantial local air pollution ensued during interleaving the substrates and glass plates in a pool of such solution and during subsequent disassembly of the array to retrieve the polymer impregnated substrates. Finally the diluents had to be leached out with water (or other solvents and then water) as noted above thereby posing a disposal or recovery and recycle problem. Further the high volatility of some such traditional diluents prevents carrying out the polymerization rapidly, e.g. in 10 to 40 minutes because the high energy release during such rapid polymerization results in boiling of the diluent, forming bubbles in the polymer and/or forcing polymerizing liquid out of the substrates. Hence the use of low boiling, environmentally unfriendly diluents had rendered uneconomic until now continuous machinery for making ion exchange membranes since the production rate of such machines is uneconomically low if the polymerization time must be several hours. For example U.S. Pat. No. 4,231,855 describes cation exchange membranes prepared from 2-sulfoethyl methacrylate, ethylene glycol dimethacrylate and benzoyl peroxide. The non-polymerizable diluent was isobutyl alcohol (b.p. 108° C.). The polymerizable mix was poured into a tray in which were laid in alternating fashion glass plates and cloth substrates. The resulting array was heated at 80° C. for 17 hours. It is obvious that a continuous machine having, for example, a heating zone 48 feet in length would have a production rate under such circumstances of only 0.047 linear feet per minute (i.e. 68 linear feet per 24 hours).

The above mentioned problems are overcome according to the present invention which inter alia provides a process for rapidly manufacturing reinforced ion exchange membranes from:

(I) a liquid characterized by having a viscosity less than about 10 poise at shear rates in excess of about 1 cm/sec and comprising at least in part components polymerizable to such membranes and by comprising no non-polymerizable solvents other than water which have a boiling point of less than about 185° C.; and from:

(II) at least one quasi-continuous, pliable, support substrate having a multiplicity of apertures extending through the substrate from one face thereof to the other face thereof, said substrate further characterized by being insoluble in the above mentioned liquid at temperatures and times prevailing during the process.

The process comprises:

(a) forming a continuous sandwich of the substrate (or a pack of substrates) by juxtaposing on each face of the substrate pliable film extending beyond the side edges of the substrate, the film characterized by not being swollen by or permeable to the above mentioned liquid at the temperatures and times prevailing during the process;

(b) passing the sandwich of substrate and film in a more or less vertical direction downwardly between a pair of horizontal squeeze rolls and joining the side edges of the film before passing the sandwich through the squeeze rolls;

(c) introducing the above mentioned liquid into the pocket formed in the sandwich above the squeeze rolls;

(d) pulling the sandwich and liquid between the squeeze rolls thereby filling the apertures in the substrate with the liquid;

(e) thereafter rapidly polymerizing the polymerizable components in the liquid resulting in the formation of a reinforced polymer sheet.

Preferably the support substrate is a woven or non-woven fabric although microporous diaphragms can equally well be used, e.g. microporous polyvinyl chloride or polyacrylontrile diaphragms.

Preferably the components in the above mentioned liquid which are polymerizable comprise polymerizable electrolytes such as vinyl sulfonic acid, styrene sulfonic acid, 2-sulfoethyl methacrylate, 3-sulfopropyl acrylate, 3-sulfopropyl methacrylate, 2-methyl-2[(1-oxo-2-propenyl)amino]-1-propane sulfonic acid, 2-methyl-2-[(1-oxo-2-methyl-2-propenyl)amino]-1-propane sulfonic acid, vinyl benzyl trialkyl ammonium hydroxide, methacrylatoethyl-trialkyl ammonium hydroxide, methacrylamido-propyl trialkyl ammonium hydroxide, N-alkyl-2-methyl-5-vinyl pyridinium hydroxide, N-methyl-2-vinyl pyridinium hydroxide, N-methyl-4-vinyl pyridinium hydroxide, vinyl benzyl dialkyl sulfonium hydroxide, N,N-dialkyl amino ethyl methacrylamide, N,N-dialkyl amino ethyl acrylate, N,N-dialkyl amino ethyl methacrylate, 3-dialkyl amino neopentyl acrylate, 3-N,N-dialkyl aminopropyl methacrylamide and their salts.

Generally the above mentioned alkyl groups will be methyl though other alkyl or mixed alkyl groups can be used, for example hydroxy ethyl. Particularly useful among the salts of such polymerizable electrolytes are the McKee type salts in which the counterion is a low molecular weight non-polymerizable organic ion. Examples of such McKee type polymerizable electrolytes include:
- vinyl benzyl trimethyl ammonium paratoluene sulfonate
- benzyl dimethyl sulfonium styrene sulfonate
- vinyl benzyl dimethyl sulfonium benzene sulfonate
- benzyl trimethyl ammonium parastyrene sulfonate
- tetraethyl ammonium parastyrene sulfonate.

The use of such polymerizable electrolytes as at least one component of the above mentioned liquid avoids (after the above mentioned polymerization step) a chemical reaction step i.e. a step in which further covalent bands are formed in order to introduce ion-exchange groups (e.g. by sulfonation) or to convert functionizable moieties to ion exchange groups (e.g. by alkylating tertiary amine groups or hydrolyzing sulfonic ester groups). Such chemical reaction steps are generally costly and generally produce waste products which are difficult to dispose of.

Alternatively the components in the above mentioned liquid which are polymerizable comprise species which spontaneously form ion exchange groups during polymerization. Examples include:

vinyl benzylhalide and N,N-dialkyl amino ethyl methacrylamide, 3-N,N-dialkyl amino propyl methacrylamide, N,N-dialkyl amino ethyl methacrylate, N,N-dialkyl amino ethyl acrylate, vinyl benzyl dimethyl amine, vinyl benzyl methyl sulfide, 3-dimethyl amino neopentyl acrylate, 2-methyl-5-vinyl pyridine, 2-vinyl pyridine or 4-vinyl pyridine vinyl benzyl halide and dimethyl ethanol amine or triethanol amine alkyl paratoluene sulfonates or alkyl benzene sulfonates and any of the above mentioned polymerizable tertiary amines or secondary sulfides.

Preferably any non-polymerizable diluents other than water are not only high boiling (i.e. have a boiling point greater than about 185° C.) but have a low level of toxicity to humans, are soluble in water and are biodegradable. Preferred diluents other than water meeting such requirements include:

|  | B.P. °C. | Dielectric Constant | Solubility Parameter |
|---|---|---|---|
| dimethyl sulfoxide | 189 | 47 | 11.8 |
| formamide | 210 | 109 | 16.2 |
| 1,3 propylene glycol | 214 | 35 | 12.1 |
| 1,3 butane diol | 208 |  | 10.8 |
| dipropylene glycol | 232 |  | 9.1 |
| 1,2-propylene glycol | 188 | 32 | 11.6 |
| propylene carbonate | 242 | 65 | 11.4 |
| gamma-butyrolactone | 204 | 39 | 11.6 |
| 1-methyl-2-pyrrolidinone | 202 |  | 10.3 |
| sulfolane | 287 | 43 | 11.4 |

-continued

|  | B.P. °C. | Dielectric Constant | Solubility Parameter |
|---|---|---|---|
| glycerin | 290 | 43 | 13.0 |
| 1,2,3-butane triol | 264 |  | 11.5 |
| 1,2,6-hexane triol | >185° |  |  |
| 1,2,4-butane triol | >185° |  |  |

(The solubility parameters listed above are calculated on an internally self-consistent basis and differ slightly from values reported in the literature).

The components in the above mentioned liquid which are polymerizable generally also comprise monomers capable of crosslinking the resulting polymers. Preferred crosslinkable monomers include divinyl benzene, ethylene glycol dimethacrylate, bisphenol-A-dimethacrylate, 1,3 butane diol diacrylate 1,4 butane diol diacrylate, 1,3 butane diol dimethacrylate, 1,4 butane diol dimethacrylate, 1,4-cyclo hexane dimethacrylate, diethylene glycol diacrylate, diethylene glycol dimethacrylate, 2,2-dimethyl propane diol dimethacrylate, para phenylene diacrylate, N,N'-dimethylene bisacrylamide, N,N'-methylene bisacrylamide and N,N' methylene bis methacrylamide.

BRIEF DESCRIPTIN OF THE DRAWINGS

DESCRIPTION OF PREFERRED EMBODIMENTS

Figure 1:
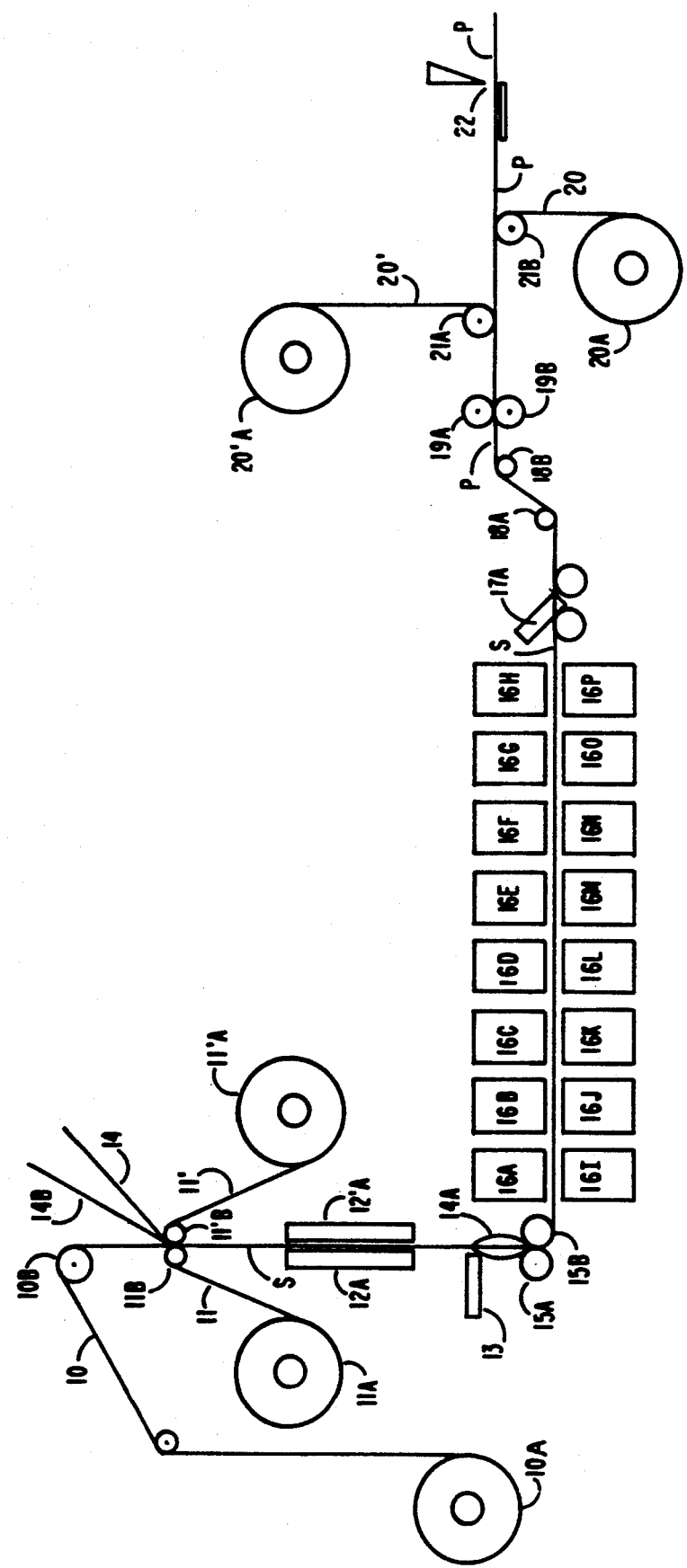
FIG. 1 is a schematic representation in vertical cross-section of a preferred apparatus according to the invention.
Figure 2:
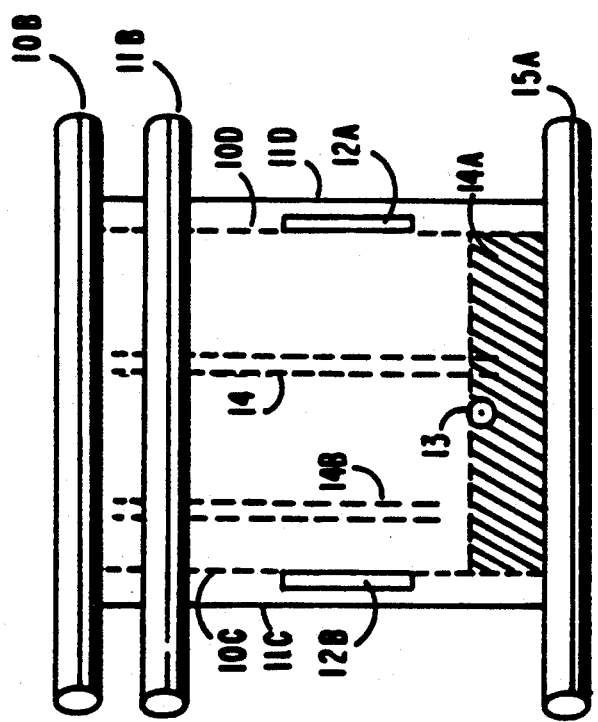
FIG. 2 is a schematic representation in a vertical cross-section (perpendicular to the section of FIG. 1) showing a preferred arrangement of items 10b, 11b, 12a, 12'a, 13, 14, 14a, 14b, and 15a of FIG. 1.

Referring to FIGS. 1 and 2, the numeral 10 indicates a continuous, pliable substrate or pack of such substrates, each having a multiplicity of apertures extending from one surface through the body of the substrate to the other. The substrate may be, for example, woven or non-woven fabric, paper (including synthetic paper), microporous diaphragm and the like. The substrate should be insoluble in but wettable by the polymerizable liquid (see below) at the temperatures and in the times encountered in the manufacturing process. In addition it should be reasonably stable under the use conditions likely to be encountered by the ion exchange membrane which is the product of the apparatus. Obviously the choice of material of construction of the substrate depends, inter alia, on the composition of the polymerizable liquid which will be used to make the supported polymer sheet as well as, as noted, on the polymerization temperature and time. Examples will be given below. For any polymerizable liquid suitable substrates can be easily chosen by preliminary trials. Substrate(s) 10 are played out from substrate(s) roll 10a. Substrate or substrate pack 10 passes over roll 10b and continues downwardly in a generally vertical direction between generally horizontal rolls 11b and 11'b. The plane defined by the axes of rolls 11a and 11b need not be generally horizontal. Numerals 11 and 11' represent pliable films or foils having compositions which are not soluble or substantially swollen in the polymerizable liquid at the operating temperatures and within the operating times of the apparatus. In additiion they should release relatively easily from the finished polymer sheet as will be more fully discussed below. Further they should have low permeability to any volatile components of the polymerizable liquid and preferably to oxygen from the air. Suitable films or foils comprise, for example without limitation, polymers such as polyethylene terephthalate, cellulose acetate, cellulose triacetate, polytetrafluoroethylene-co-hexafluoropropylene, polytetrafluoroethylene, polytrifluoro chloro ethylene, nylon 6, nylon 6,6, nylon 11, nylon 12, polyethylene-co-methacrylic acid salt, polycarbonate, polyimide, polypropylene, polyvinyl alcohol and metals such as aluminum, copper, stainless steel and phosphor bronze. The films (foils) 11 and 11' are played out from film rolls 11a and 11'a over rolls 11b and 11'b respectively, continuing downwardly in a generally vertical direction between said rolls on each side (face) of substrate(s) 10, forming initially at rolls 11b and 11'b a loose sandwich. Although a single substrate or pack of substrates are shown by the numeral 10 and a single roll of substrate or pack by the numeral 10a, more than one such roll and more than one such substrate or pack of substrates may be combined by roll 10b or other similar rolls into the sandwich optionally interleaved as desired by additional foils. The position of the rolls 10a, 11a and 11'a are not critical to the invention as long as topologically substrate 10 can be fed between films 11 and 11'. Thus for example, the exact positions of rolls 10a and 11a shown in FIG. 1 cannot be interchanged.

The linear vertical speeds of substrate(s) 10 and films 11 and 11' are equal, at least below rolls 11b and 11'b. The width of substrate 10 is less than that of films 11 and 11' as shown in FIG. 2 by the respective lateral edges designated respectively 10c and 10d on the one hand and 11c and 11d on the other. (Film 11' is not visible in FIG. 2, essentially registering with film 11 and lying behind the latter in FIG. 2). The average plane of the loose sandwich formed below rolls 11b and 11'b is preferably within about 45° of vertical. Within such preferred limitation the sandwich passes substantially vertically downward to and between squeeze (nip) rolls 15a and 15b. Between the pair of rolls 11b and 11'b on the one hand and the pair 15a and 15b on the other the lateral edges of films 11 and 11' are caused to be at least temporarily joined, composited or sealed, for example by means 12'b, 12a, 12b and 12'a (12'b lies behind 12'a in FIG. 1 and behind 12b in FIG. 2). Such means may, for example, be heat sealing means such as those described in U.S. Pat. No. 4,502,906 in which case such means should be designed to stretch films 11 and 11' substantially taut laterally before and/or during the sealing or joining operation. The purpose of the sealing or joining is to avoid substantial seepage and/or weeping of polymerizable liquid out of the sandwich comprising films 11, 11' and substrate(s) 10 at least before nip rolls 15a and 15b. The joining preferably continues after such rolls unless such liquid is sufficiently viscous to resist seepage and/or weeping inherently or until it becomes so viscous. The seal may comprise male-female engaging grooves in which case rolls 15a and b as well as other rolls may contain grooves to accommodate such locks. The seal may be accomplished by setting and non-setting adhesives which are applied or transferred to the lateral edges (or near such edges) of films 11 and 11' by sealing means 12a and b and 12'a and b, applied or transferred to the films before such sealing means or may be an integral part of the films on rolls 11a and 11'a. In the latter case at least the adhesive area may be covered by release film or alternatively the region of the film on the opposite face of the film from the adhesive area may be naturally an abherent (i.e. release) surface or treated to be such. It will be understood that if the material of films 11 and 11' is naturally abherent to a desired adhesive then the area of the films to which the adhesive will be applied will generally be treated to promote adhesion. Similarly if it is desired to use hot wire, ultrasonic or other heat sealing and the materials of films 11 and 11' are not naturally heat sealable then at least the area to be sealed may be treated to promote such heat sealing.

As a further example the seal may be made by sewing or stitching preferably using an easy-opening stitch. The seals may also be provided by belts pressing against areas of the films at or near the lateral edges of the films, such belts beginning above squeeze rolls 15a and b, e.g. in the regions defined by 12a and 12'a on the one hand and 12b and 12'b on the other and continuing at least through squeeze rolls 15a and b. In such case grooves may be provided in the latter rolls to accommodate such belts. The belts may be firmly pressed against films 11 and 11' by closely spaced small diameter wheels or rollers, abherent bars and the like.

The effect of the temporary or permanent seal between the two films 11 and 11' at their lateral edges is to create a pocket in the sandwich S above squeeze rolls 15a and 15b. One or more conduit means 14 extend toward or into said pocket as indicated in FIGS. 1 and 2. Conduit means 14 must of course enter said sandwich before the edge seals are formed, for example from above between guide rolls 11b and 11'b in which case either the gap between such rolls must be sufficient to accommodate such conduit means (including displacing rolls 11b and 11'b vertically from each other) or one or both rolls may have appropriate grooves. Conduit means 14 may also enter from the side of sandwich S below rolls 11b and 11'b but above sealing means 12a, b and 12'a, b. Only one such conduit means 14 is shown in FIGS. 1 and 2 but it is clear that more than one may be used. For example there may be conduit means 14 on each side of substrate 10 and/or distributed along the width of said substrate. The function of said one or more conduit means 14 is to introduce polymerizable liquid into the pocket of the film-substrate(s)-film sandwich to create a shallow pool of polymerizable liquid along substantially the whole width of substrate 10 and in the region in which films and substrate(s) converge into the gap between squeeze rolls 15a and b. Such pool is indicated by numeral 14a. Conduit(s) 14 may have any suitable cross-section e.g. that of an essentially cylindrical tube or a flattened tube. The dimensions of conduit(s) 14 depend on the specifics of the manufacturing process. For example if substrate 10 is about 14 inches wide, moves at a rate of 60 inches per minute, has a void volume of about 67 percent and a nominal thickness of about 0.020 inches then the necessary flow of polymerizable liquid will be about 0.6 liters per minute. Further if the length and diameter of conduit 14 are about 1 meter (39 inches) and about 0.2 cm resp. the density and viscosity of the polymerizable liquid are 1 g/cm$^3$ and 1 centipoise resp., then the pressure loss in such conduit will be about 5 psi. If the viscosity is instead about 10 poise then at the same volumetric flow rate the pressure loss in conduit 14 will be about 15 psi if the internal diameter of said conduit is about 0.8 cm. It might be preferable to use ten conduits 14 each about 0.5 cm internal diameter, therefore also achieving better distribution of such more viscous polymerizable liquid along pool 14a.

The level in pool 14a may be controlled visually, by a precision metering pump, a constant head device (such as a constantly overflowing head tank or a pneumatic blowcase, the latter with direct inert gas pressurization or preferably with an inert diaphragm separating the polymerizable liquid from the pressurizing fluid), by feeding excess to the pool and continuously sucking out such excess through conduit 14b and/or by a level sensing means indicated by numeral 13. The latter is shown as outside sandwich S but may equally be inside such sandwich. Suitable level sensors include ultrasonic devices utilizing a piezoelectric transmitter and receiver; capacitance devices based on the difference in dielectric constant between the polymerizable liquid pool and the gas/vapor space above it; inductive devices based on the difference in electrical conductivity between the pool and the gas/vapor space. Signals from such sensors can be used to activate on-off flow control valves, proportional valves, on-off metering pumps, and/or proportional metering pumps by control schemes well-known in the art. Particularly preferred are control systems in which the main flow at a value slightly below the average flow is provided by a principal flow-control valve or metering pump and a much smaller flow in parallel to the main flow is regulated through the agency of sensing means 13.

As substrate 10 passes through pool 14a air (or other gas or vapor) in the apertures of the substrate is displaced at least in part in substantially all, preferably all of said apertures by polymerizable liquid. The rate and efficiency at which such displacement occurs depends, inter alia, on the average size and distribution of sizes of apertures in such substrate, on the viscosity of the polymerizable liquid, and on the interfacial tension between said liquid and the material of the substrate. It is found however that when the height of pool 14a is in the range of 10 to 30 cm above the plane tangent to the uppermost surfaces of rolls 15a and b and the speed of substrate 10 is in the range of from about 1 to about 10 cm/sec then efficient displacement of gas or vapor can generally be obtained with suitable substrates and polymerizable liquids having viscosities less than about 10 poise.

The gap between squeeze rolls 15a and b is preferably set to be approximately equal to the sum of the nominal thicknesses of the films 11 and 11' and substrate or substrate pack 10. If the gap is much smaller than said sum then the texture of the surface of the finished polymer sheet will be essentially that of the surface of the substrate. If the gap is much larger than said sum there may be an unnecessary and often undesirable thick layer of unsupported polymer on the surfaces of the finished polymer sheet. One or both of said rolls 15a and b may be of an elastomeric material or covered on the curved surface with such material and the other, if not comprising such elastomeric material, then of a hard material such as aluminum, stainless steel, fiber reinforced polymers such as polyester, epoxy, phenolic or aminoplast resins. It is preferred if roll 15a has at least 1 centimeter of the surface consisting of 20 to 40 Shore A durometer elastomer and roll 15b has at least the surface consisting of the above mentioned hard material. Preferably rolls 15a and b are designed to spread films 11 and 11', i.e. to make them taut laterally. The plane of the axes of rolls 15a and b should be substantially perpendicular to the plane of substrate 10 immediately above such rolls, i.e. the plane of the axes will generally deviate from horizontal in the same direction and by about the same angular quantity as the substrate varies from vertical as discussed above.

The sandwich S issuing continuously from rolls 15a and b thus consists of substrate(s) substantially impregnated with polymerizable liquid with covering, pliable films or foils 11 and 11' in contact on each side. The polymerizable liquid is then allowed or caused to cure to at least to the glassy, gel or solid state. The polymerizable liquid may be self-curing at ambient temperature or formulated including polymerization initiators, catalysts and/or promoters and/or inhibitors effective at ambient temperature. In the latter case it is preferred that such agents be added to and thoroughly mixed into the polymerizable liquid only shortly before such liquid enters conduit(s) 14. Nevertheless pool 14a constitutes a "feed-and-bleed pot" and the mixture of polymerizable liquid and polymerization agent must have a suitable pot life. This may be obtained by including a suitable consumable polymerization inhibitor which delays onset of ambient temperature polymerization. Polymerization is generally a more or less exothermic process. If the polymerizable liquid comprises vinyl or related monomers and/or unsaturated polymers and a free radical polymerization initiator or initiator system then it may be necessary to cool the sandwich emerging from rolls 15a and b in order to avoid generation of free radicals more rapidly than they can be efficiently used by the polymerizable liquid.

Generally the apparatus and process will be easier to control if the polymerizable liquid does not spontaneously polymerize at ambient temperature or contain substantial amounts of polymerization agents effective at ambient temperature. In such case the polymerizable liquid may spontaneously polymerize or cure at an elevated temperature and/or it may be formulated with polymerization initiators, promoters and/or catalysts effective at such temperatures. In many cases such polymerization initiators function by means of and through free radicals produced by spontaneous decomposition of the initiators into free radicals. The rate of such decomposition at a given temperature depends on the chemical identity of the initiator and for a given (i.e. specific) initiator increases strongly with temperature. Such initiators are frequently classified in terms of the temperature (°C.) at which the first order half-life is 10 hours for example:

| | |
|---|---|
| bis(4-tertiary butyl-cyclohexyl)peroxy dicarbonate: | 50 |
| 2,2 azobis[2,4-dimethyl]pentane nitrile: | 52 |
| di(2,4-dichlorobenzoyl)peroxide: | 54 |
| 2-(tertiary butylazo)-4-methoxy-2,4-dimethyl pentane nitrile: | 55 |
| dilauroyl peroxide: | 62 |
| 2,2'-azobis(isobutyronitrile): | 64 |
| 2,2' azobis(2-methylbutyronitrile): | 67 |
| diacetyl peroxide: | 69 |
| 2-(tertiary-butylazo)-2,4-dimethyl pentane nitrile: | 70 |
| dibenzoyl peroxide: | 73 |
| tertiary butyl peroctoate: | 77 |
| 2-(tertiary-butyl azo)isobutyro-nitrile: | 79 |
| 2-(tertiary butyl azo)-2-methyl butane nitrile: | 82 |
| 1,1' azobis(cyano cyclohexane): | 88 |
| 1,1 di(tertiary butyl peroxy)cyclohexane: | 95 |
| 1-(tertiary butyl azo)cyclohexane carbonitrile: | 96 |
| 1-(tertiary amyl azo)cyclohexane carbonitrile: | 99 |
| tertiary butyl perbenzoate: | 105 |
| dicumyl peroxide: | 115 |
| di-tertiary butyl peroxide: | 126 |

As pointed out above polymerization is generally a more or less exothermic process. At least in the case of polymerization initiated by free radicals this circumstance frequently results in a more or less sharp peak in the temperature of the polymerizing material which may be explained as follows: As the temperature of the polymerizable material rises from external heating to about that corresponding to the 10 hour half life the radical initiator begins to decompose at a rate of about 0.1 percent per minute. If the concentration of initiator is sufficiently high, the efficiency of the radical also high (in terms of number of chemical bonds formed per radical) and the heat of polymerization is high, then the temperature of the polymerizing material can increase rapidly. In a typical case if the temperature increases to a value about 30° C. higher than the temperature corresponding to the 10 hour half life then the decomposition rate of the initiator will increase to about 5 percent per minute and 90 percent of the initiator will decompose in less than 1 hour. Such high rate can be quite inefficient. A high concentration of free radicals (whether as initially formed radicals or radicals on polymer chains) can lead to recombination of radicals rather than addition of monomeric units to the radicals and, in the case of some initiators, such high concentration can result in second order decomposition of the initiator without formation of additional free radicals. In the traditional method of making isoporous, gel-type membranes by interleaving glass plates and substrates saturated with polymerizable liquid, the problem of extreme exotherm and inefficient use of initiator has been solved by using a low rate of heating, a long period of polymerization (several hours), a moderate amount of initiator, relying on the heat capacity of the glass plates to achieve a maximum exotherm temperature of not more than about 40° C. above the temperature corresponding to the 10 hour half-life temperature. In contrast, in the method and apparatus according to the present invention, one would like to achieve a relatively high linear production rate of polymer sheet in an apparatus of reasonable length, i.e. to achieve gelation and preferably the final stage of cure in the range of from about 10 to about 100 minutes. Such is very difficult to achieve using a single polymerization initiator since a combination of initiator concentration and temperature which will lead to early onset of polymerization may also lead to an excessive exotherm. It is preferred according to the apparatus and process of this invention to use two or more polymerization initiators differing in temperatures corresponding to a 10 hour first order half-life by at least about 10° C. and preferably by not more than about 15° C. Preferably the lowest (lower) 10 hour-half-life-temperature in said combination of initiators is not less than about 10° C. greater than ambient temperature. For example one may choose 2-(tertiary butyl azo)-4-methoxy-2,4-dimethyl pentane nitrile, dilauroyl peroxide or 2,2'-azobis (isobutyronitrile) as the lower temperature initiator and dibenzoyl peroxide, tertiary butyl peroctoate or 2-(tertiarybutyl azo) isobutyronitrile as the higher temperature initiator. As an example of a combination of three initiators one might choose di(2,4-dichlorobenzoyl)peroxide, 2,2'-azobis(isobutyronitrile) and 2-(tertiary butyl azo)-2-methyl butane nitrile. There is of course no disadvantage (nor great advantage) in blending in appropriate proportions all of those free radical initiators tabulated above or a selection spanning the desired polymerization temperature range. The "low temperature" initiator may be a photoinitiator such as:

benzoin ethyl, isopropyl and/or methyl ether
4,4'-bis(dimethyl amino)-benzophenone
2-(n-butoxy)ethyl-4-dimethyl amino benzoate
di-camphorquinone
2,2'-diethoxyacetophenone
4,4'-dimethoxybenzoin
2,2'-dimethoxy-2-phenylacetophenone
1-hydroxycyclohexyl phenyl ketone
2-hydroxy-2-methylphenylpropane-1-one
methyl benzoyl formate As is well known in the art, some of the above photoinitiators require a hydrogen donor or co-initiator, which may be inherent in the polymerizable liquid or added for the purpose e.g. primary or secondary alcohols or ethers, thiols or tertiary amines in which at least one of the substituents is a primary or secondary aliphatic group. Photosensitizers such as thioxanthone, eosin or methylene blue may be useful.

Such photoinitiators advantageously result in rapid initiation of polymerization. Since part of the polymerizable liquid may be in the shadow of the substrate, it is preferred to use a thermally activated initiator (such as 2,2'-azobis(isobutyronitrile) and/or 2-(tertiary-butyl azo)isobutyronitrile (the choice depending on the exotherm generated by the photoinitiation) to complete the polymerization.

The first stage initiator may be a promoted or redox free radical initiator such as cumene hydroperoxide, 1-butyl peroxy-2-ethyl hexanoate or 1,1-bis(tertiary butyl peroxy)-3,3,5 trimethyl cyclohexane plus a transition metal salt (e.g. cobalt naphthenate); dibenzoyl peroxide plus dimethyl aniline; paramenthane, cumene or tertiary butyl hydroperoxides plus e.g. dodecyl mercaptan. When such promoted or redox systems are used then one part of the system, preferably the promoter or reducing agent, should be added with thorough mixing to the polymerizable liquid just before it enters conduit(s) 14 in order to minimize the extent of polymerization in pool 14a.

Particularly useful in this invention are di- and triperoxides having two or more different peroxide types in the same molecule which decompose sequentially. Also particularly useful are initiators which can function both as photo- and thermal-initiators e.g. di-tertiary butyl peroxide.

It may be apparent from the above discussion that it may be very important to control the temperature in the polymerizing liquid in sandwich S issuing from squeeze rolls 15a and b in order to effect efficient use of polymerization initiator and high degrees of polymerization per gram-equivalent of initiator and/or per unit of light and/or thermal energy. In addition such control may be necessary to avoid damage to the substrate 10, the cover films 11 and 11' and/or volatilization of components of the polymerizable liquid. Thus for example it may be necessary to cool sandwich S at the same time as it is being irradiated to cause polymerization or first to heat such sandwich to initiate polymerization and then to cool it to avoid excessive exotherm. Detailed, specific instructions cannot be given since the exotherm depends, inter alia, on: the rate of irradiation (in photoinitiation); the concentration of initiators; the group (if any) of initiators used; the rate of heating; the heat of the polymerization reaction; the linear velocity of the sandwich S; the heat capacity of the sandwich; and the heat capacity and thermal conductivity of any parts of the apparatus which come in contact with the polymerizing sandwich. To effect such temperature control it is preferred that immediately downstream (below) squeeze rolls 15a and b the direction of transit of sandwich S be changed from substantially vertical to substantially horizontal as shown in FIG. 1. As shown in such FIG. 16a through 16p represent a group of means for irradiating, heating and/or cooling sandwich S. The nature and number of such means will depend strongly on the details of the polymerizing system and although 16 such individual means are shown there may in any specific embodiment of the invention be more or less (including none at all) and any or any group may be omitted. For example 16a through h may be omitted and heating and/or cooling accomplished through means 16i through p only. Means 16i through p may also support moving sandwich S in which case some at least of 16i through p may have only a support function. By way of example (without limitation) 16a,b and c may constitute a group of medium pressure Vycor mercury lamps having quartz or Vycor envelopes and operating at roughly 80 watts per centimeter of arc. They may be of the electrode or electrodeless type. In either case means 16i through l and 16d may be cooling means, e.g. internally cooled with water, chilled water or refrigerant. 16d may be one or more fans or blowers for cooling air or one or more outlets for pressurized air. Continuing, 16e through h may be electrically activated, controlled, infra red heating elements or such elements may be in direct contact with sandwich S and heated electrically, with hot water or other heat transfer means or with steam. Means 16e through h may constitute part or all of the high temperature sink of a heat pump or refrigeration machine cooling means 16c through l as mentioned above. If elements 16i through h are heating means then 16m through p may individually be only support means or may also be heating means.

By way of additional non-limiting example: 16i, k, m and o may be individually controlled heating means in direct contact with sandwich S; 16b, d, j and l may be individually controlled cooling means; 16a, c, and e may be inert (i.e. neither heating or cooling) but exert moderate pressure on sandwich S; 16n and p may be inert, support means; and elements 16f through h omitted.

By way of further non-limiting example, elements 16a, b and/or c may be Electrocurtain (TM) processors (e.g. Energy Sciences, Woburn, Mass., U.S.A.); multiple planar-cathode processors; infra-red radiators; microwave; gamma ray (e.g. cobalt 60), X-ray or electron beam processors.

Alternatively elements 16i through p may be air diffusers providing a cushion of air on which sandwich S floats, the temperature of air issuing from each element being controlled to give the desired temperature profile in sandwich S Elements 16a through h may then be at least in part other polymerization initiators e.g. u.v. and/or i.r. emitters.

Whether the polymerization of the sandwich S is carried out in a substantially horizontal course (as described above) or in a substantially vertical run (i.e. as a more or less direct extension of the plane of S above rolls 15a and b depends primarily on the viscosity and capillary effects of the polymerizable liquid in the sandwich S below rolls 15a and b. If such viscosity and capillary effects permit slumping or sagging of such liquid in the sandwich below 15a and b then it is preferable that polymerization be carried out in a more or less horizontal plane as illustrated in FIG. 1. Even in the latter case the angle which the sandwich makes with dead horizontal need not be zero. Further the plane of the sandwich between elements 16a through h on the one hand and 16i through p on the other may be slightly curved in two dimensions, i.e. in the machine direction and in the transverse direction in order to achieve uniform profile in the finished sheet. The optimum angle of the sandwich with horizontal (in the case of very fluid polymerizable liquids having little capillary interaction with the substrate(s) and covering films) seems to depend on the details of the interaction of the components of the sandwich during polymerization, possibly on the differential thermal expansion of the components, the moduli of the substrate(s) and the films as well as on the tension applied to the films. Similar empirical factors seem to affect the choice of machine direction curvature (if any) of the sandwich and camber (if any).

For control of the temperature of the polymerizing liquid in the sandwich the temperature may be measured for example between elements 16a through h by means of one or more non-contact radiation or contact thermometers well known in the art, the readings therefrom being used manually or automatically to control the heat input from or to the various elements 16a through p.

Preferably those of elements 16a through p which come in direct contact with sandwich S are thinly coated with an abherent material i.e. one having a low coefficient of friction with the materials of films 11 and 11' by films of such low-coefficient-of-friction materials anchored to the apparatus and/or to said elements. A preferred material is Kapton (TM) polyimide film coated with polyperfluoroethylene-propylene copolymer (duPont Co., Wilmington, Del., U.S.A.).

The presence of oxygen is undesirable in many polymerizable liquids useful in the present invention since, for example, if a free radical type polymerization initiator is used such oxygen can readily add to the growing polymer chain to form a peroxy radical. Frequently however polymer chain ending in such radical does not readily continue to grow and so the rate of polymerization of said liquids decreases. The addition of oxygen to the polymer chain results through such mechanism in a lower degree of effective crosslinking of finished polymer. Further the oxygen inclusions are often subject to scission under the conditions pertaining to the end use of the finished polymer sheet. Hence it is generally desirable to remove oxygen from the polymerizable liquid prior to introducing such tot he apparatus of this invention through conduit 14 of FIGS. 1 and 2. If desired conduit 14b or a similar conduit can be used to flush the surface of pool 14a with an inert gas such as nitrogen to prevent any subsequent absorption of oxygen i.e., from that occluded in substrate 10.

Referring again to FIG. 1, 17a and 17b (latter not shown but lies behind 17a) refer to a pair of means to remove the seals made by means 12a and b. If the seals have been made by setting adhesives, thermally or by stitching then 17a and b may be, for example, stationary or rotary knives. If the seals have been made by male-female interlocking grooves, by stitching or non-setting adhesive then 17a and b are means for separating such. Although 17a and b are shown in FIG. 1 to be immediately down-stream of elements 16a through p, they may in fact be positioned much later in the apparatus at any point prior to striping roll 21a (see below) and in the case where the polymerization of the sandwich is carried out in a generally horizontal plane as early in the course of the sandwich as a point between squeeze rolls 15a and b and elements 16a and i. The latter point may appear surprising but it must be remembered that the polymerizable liquid is held by capillarity and viscous inertia in the sandwich as it is in the traditional method of polymerizing in substrates between glass plates described above. If the sealing means has been provided by belts bearing against the areas of the films 11 and 11' near or at the lateral edges of such films (as described above in connection with the discussion of means 12a and 12b and 12'a and 12'b) then 17a and b are the disengagement and return rollers for such belts.

Rolls 18a and b are adjustable guide rolls actuated by manual or automatic sensing from the edges of films 11 and 11' and intended to maintain a straight (unskewed) transit of sandwich S through the apparatus of this invention.

Rolls 21a and b strip films 11' and 11 respectively from polymer sheet P, such film then being rewound on rolls 20'a and 20a respectively. It will be clear that if the joints or seals made at or near the edges of foils 11 and 11' are not permanent then one or both such foils can be reused perhaps after some cleaning, i.e. rolls 20a and/or 20'a eventually moved into position 11a or 11'a. Alternatively such foils (again after any cleaning) can be, in such case, recycled as endless belts. On the other hand if the joints or seals are permanent and the sandwich S is opened by removing the edges then rolls 20a and/or 20'a can nevertheless be reused on a companion apparatus having an appropriate narrower width.

It is clear from an inspection of FIG. 1 that during the operation of the apparatus the angular velocities of rolls 10a, 11a and 11'a increase while such velocities of rolls 20'a and 20a decrease. Hence it is preferred that the rates of transit of sandwich S through the apparatus be controlled by a pair of squeeze rolls 19a and b at least one ot which is driven. Preferably rolls 19a and b are pushed together by adjustable hydraulic or pneumatic rams the pressures of which may be manually or automatically controlled. Preferably at least one of said rolls is of elastomeric material or covered on the curved surface (preferably to a depth of at least one centimeter) with such material and the other, if not comprising elastomeric material, then of hard material such as that described in connection with rolls 15a and b. Rolls 20'a and 20a are preferably also driven, but through adjustable friction couplings (friction clutches) controlled manually or preferably automatically to take up films 11' nd 11 (i.e. 20' and 20 respectively) at the rate at which such films are being made available by rolls 19a and b even though the diameters of rolls 20'a and 20a are changing during the operation of the apparatus.

Generally rolls 10b, 11b and 11'b, 15a and b, 18a and b, and 21a and b are idling (i.e. neither driven or braked) whereas rolls 10a, 11a and 11'a are braked through adjustable friction couplings (friction brakes) controlled manually or preferably automatically to maintain taut substrate(s) 10 and films 11 and 11' respectively. The degree of braking of the last three mentioned rolls is critical, excessively high or low braking resulting in nonuniformity of the profile of the finished polymer sheet P. Owing to the interaction of many process and apparatus parameters it is not possible to give exact instructions for the optimum tension on substrate(s) 10 and/or films 11 and 11'. However the adjustment of the brakes can be easily made within a reasonable time by observing the effects on the above mentioned profile.

Within the scope of this invention is included of the possibility of driving any and all rolls with variable speed drives, e.g. with geared, compound wound d.c. motors controlled by thyristors, or geared, variable frequency a.c. motors, such motors responding to strain (e.g. tension) measurements on substrate(s) 10 and/or films 11 and 11'.

In some applications polymer sheet P and film 20 (i.e. 11) and/or film 20' (i.e. 11') may be wound together on one roll 20a or 20'a, for example all three (P, 20 and 20') may be wound on roll 20a or polymer sheet P and film 20' may be wound together on roll 20'a. Such may be the case for example if it is desired to continue the polymerization of polymer sheet P, in roll form in a hot air oven, steam autoclave or hot water bath. It may also be the case when it is desired to process the polymer sheet P in other apparatus, for example, to remove leachable diluents; to saponify (hydrolyze) sulfonate or carboxylate ester groups; to add sulfonic acid groups; to add haloalkyl groups; to aminate haloalkyl groups; or to quaternize amine groups in the polymer sheet P.

Alternatively polymer sheet P with or without one or both films 20 and 20' may be cut into suitable lengths manually or automatically by cutting means (shear, guillotine etc. 22) well known in the art. The thus cut polymer sheets P may be useful as such, may be further cured or polymerized, leached or otherwise processed as noted above.

EXAMPLE 1

Liquid characterized by having a viscosity less than about 10 poise at shear rates in excess of about 1 cm/sec and comprising at least in part components reaCtable to form polymer is prepared from about:

| | |
|---|---|
| 54.6% divinyl benzene of commerce: | 16.6 liters |
| vinyl toluenes: | 5.5 liters |
| dixylyl ethane: | 18.9 liters |

The mixture is treated with De-Hibit 100 ion exchange resin to remove inhibitors and there are added as polymerization initiators about:

| | |
|---|---|
| bis(4-tertiary-butyl-cyclohexyl) peroxy dicarbonate | 650 grams |
| dilauroyl peroxide | 410 grams |
| dibenzoyl peroxide | 410 grams |

The mixture is thoroughly deoxygenated by spraying into a vacuum chamber having a pressure of about 2 mm Hg absolute. The mixture is fed to an apparatus according to FIG. 1 through conduit means 14. Films 11 and 11' are Mylar (TM) type M (duPont Co., Wilmington, Del., U.S.A.) 3 mils thick and 24" wide. Substrate 10 is an acrylic plain weave fabric 20 inches wide having a thread count of about 24 by 22.5 per inch, weight of about 4 ounces per sq. yd. and a thickness of about 19 mils. The yarn is spun from staple. The linear velocity is adjusted to give a polymerization time of about 25 minutes. Element 16a is inert and exerts a pressure of about 4 grams per $cm^2$ on sandwich S. Elements 16b and d are fans, regulated manually to control the temperature of sandwich S.

Elements 16c and e are inert and exert a pressure of about 0.6 gram per $cm^2$ on sandwich S. Elements 16f, g, h, o and p are omitted. Elements 16i through n are heated electrically to cause the temperature of sandwich S to increase from about 60° C. at element 16i to about 110° C. at element n. Elements 16a through e and

*i* through *r* are separated from sandwich S by Kapton abherent film anchored to the apparatus.

Means 12*a* and *b* and 12'*a* and *b* are heat welding elements according to U.S. Pat. No. 4,502,906. Element 13 is a capacitative sensor from Efector, Inc. Rolls 15*a* and 19*a* are covered with 30 durometer rubber to a depth of at least one centimeter. Rolls 15*b* and 19*b* are chrome steel. The edges of the sandwich are slit by elements 17*a* and *b* and films 20 and 20' (i.e. 11 and 11') taken up by rolls 20*a* and 20'*a* respectively. Polymer sheet P is cut by shear 22 into lengths of about 40 inches each. The resulting sheets are leached in methylene dichloride to remove the dixylyl ethane and sulfonated according to U.S. Pat. No. 2,962,454. The resulting cation exchange membranes have ion exchange capacities of about 2.8 milligram equivalents per gram of dry sulfonated polymer in sodium form (i.e. not including substrate) and water contents of about 50 percent of wet sulfonated polymer in sodium form (again not including substrate). The membranes are useful in the electrodialytic production of potable water from brackish water.

The temperatures corresponding to the 10 hour first order half lives of the polymerization initiators are about 50, 62 and 73° C., i.e. the differences lying in the range of from about 10° to about 15° C.

The leaching with methylene dichloride to remove dixylyl ethane and the subsequent sulfonation result in substantial waste disposal and/or recovery and recycle requirements. Such waste handling requirements are substantially eliminated by the processes of the following examples.

EXAMPLE 2

The apparatus, films and substrate of Example 1 are used. A liquid characterized by having a viscosity less than about 10 poise at shear rates in excess of about 1 cm/sec and comprising at least in part components reactable to form polymer is prepared from about:

| | |
|---|---|
| 2-(tertiary butyl azo)-4-methoxy-2,4-dimethyl pentane nitrile: | 185 grams |
| 2,2'-azobis(isobutyronitrile): | 85 grams |
| 2-(tertiary-butyl azoisobutyro) nitrile: | 260 grams |
| dimethylaminethyl methacrylate: | 20 liters |
| ethylene glycol dimethacrylate: | 20 liters |

The temperature of the sandwich is controlled in the range of from about 65° to about 115° C. The speed of sandwich S is adjusted to give a polymerization time of about 25 minutes. The cut polymer sheets are interleaved with Mylar film and cured in an oven at 115° C. after which the sheets are leached for several days in 2 normal hydrochloric acid. The sheets are found to be anion exchange membranes having a low transport number for hydrogen ions in hydrochloric acid solutions having concentrations in the range of from about 0.5 to 1.0 normal. They are useful in the electrodialytic recovery of acids having a low formula weight.

In this example no non-polymerizable diluent is used. Compared to the process of Example 1, waste handling requirements are substantially eliminated. The dimethyl amino ethyl methacrylate may be replaced with equivalent amounts of dimethyl ethyl acrylate, dimethyl amino ethyl methacrylamide, 3-dimethyl amino neopentyl acrylate or 3-N,N-dimethyl amino propyl methacrylamide.

EXAMPLE 3

The apparatus of Example 1 is used except the substrate is a fabric woven from polypropylene staple fiber. A liquid characterized by having a viscosity less than about 10 poise at shear rates in excess of about 1 cm/sec and comprising at least in part components reactable to form polymer is prepared from about:

| | |
|---|---|
| ethylene glycol dimethacrylate: | 168 lbs. |
| 1-methyl-2-pyrrolidinone: | 359 lbs. |
| 80% divinyl benzene of commerce: | 147 lbs. |
| 2 sulfoethyl methacrylate: | 401 lbs. |
| 2,2' azobis(2-methyl butyronitrile): | 10.1 lbs. |

The resulting liquid is thoroughly deoxygenated. The linear velocity of the apparatus is adjusted to give a polymerization time of about 25 minutes. Elements 16*i* through *n* are heated electrically to cause the temperature of sandwich S to increase from about 70° C. at element 16*i* to about 100° C. at element 16*n*. The polymer by shear 22 into lengths of about 40 inches each. The resulting sheets are leached in dilute aqueous sodium bicarbonate solution to remove the 1-methyl-2-pyrrolidinone and convert the membrane to the sodium form. The resulting membranes are found to be substantially completely polymerized and to be useful in the electrodialytic production of potable water from brackish water. The non-polymerizable diluent 1-methyl-2-pyrrolidinone has a boiling point of 202° C., a vapor pressure at room temperature of about 0.3 mm Hg, a low order of toxicity, infinite solubility in water and is biodegradable. It is therefore environmentally friendly and does not present a substantial waste handling problem.

EXAMPLE 4

The apparatus of Example 1 is used. The substrate is a fabric woven from acrylic staple fiber. A liquid characterized by having a viscosity of less than about 10 poise at shear rates in excess of about 1 cm/sec and comprising at least in part components reactable to form polymer is prepared from about:

| | |
|---|---|
| 2-methyl-2-[(1-oxo-2-propenyl)amino]-1-propane sulfonic acid (MOPAPS) | 60.9 kg |
| paramethoxy phenol | 12.3 grams |
| 1-methyl-2-pyrrolidinone | 64 liters |
| demineralized water | 6.4 liters |
| ethylene glycol dimethacrylate | 55.4 liters |
| dibenzoyl peroxide | 1.86 kg |
| 1,1'azobis(cyanocyclohexane) | 0.94 kg |

The resulting liquid is thoroughly deoxygenated. The linear velocity of the appparatus is adjusted to give a polymerization time of about 25 minutes. Elements 16*i* through *n* are heated electrically to cause the temperature of sandwich S to increase from about 70° C. at element 16*i* to about 100° C. at element *n*. The polymer sheet P is cut by shear 22 into lengths of about 40 inches each. The resulting sheets are leached in dilute aqueous sodium bicarbonate solution to remove the 1-methyl-2-pyrrolidinone and convert the membrane to the sodium form. The resulting cation exchange membranes are found to be substantially completely polymerized and to be useful in the electrodialytic production of potable water from brackish water.

It is found that the MOPAPS can be replaced in whole or in part with an equivalent amount of 2-methyl-2-[(1-oxo-2-methyl-2-propenyl)amino]-1-propane sulfonic acid. As in Example 2 the process is environmentally friendly and does not present a substantial waste handling problem.

EXAMPLE 5

The apparatus of Example 1 is used. The substrate is a fabric woven from acrylic staple fiber. A liquid characterized by having a viscosity less than about 10 poise at shear rates in excess of about 1 cm/sec and comprising at least in part components reactable to form polymer is prepared from about:

| | |
|---|---|
| metacrylateethyl trimethyl ammonium chloride (80% in water) | 40 kg |
| ethylene glycol dimethacrylate | 37 kg |
| dipropylene glycol | 52 kg |
| 2,2'azobis(2-methyl butyronitrile) | 0.4 kg |

The resulting liquid is thoroughly deoxygenated. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut by shear 22 into lengths of about 40 inches each. The resulting sheets are leached in water to remove the dipropylene glycol. The resulting anion exchange membranes are found to be substantially completely polymerized and to be useful in the electrodialytic production of potable water from brackish water. Dipropylene glycol has a boiling point of about 232° C. and is infinitely soluble in water. The vapor pressure at room temperature is less than 0.01 mm Hg. It has a low order of toxicity and is biologically degradable. It is therefore environmentally friendly and does not present a substantial waste handling problem.

EXAMPLE 6

The apparatus of Example 1 is used. The substrate is a fabric woven from acrylic staple fiber. About 150 kg of a solution are prepared containing about:

| | |
|---|---|
| vinyl benzyl trimethyl ammonium toluene sulfonate | 69 kg |
| 1-methyl-2-pyrrolidinone | 54 kg |
| demineralized water | 6 kg |
| divinyl benzene (80% of commerce) | 20 kg |
| 2-azo-bis(isobutyronitrile) | 0.5 kg |

The solution comprises at least in part components reactable to form polymer and has a viscosity of less than about 10 poise at shear rates in excess of about 1 cm/sec. It is thoroughly deoxyghenated. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut by shear 22 into lengths of about 40 inches each. The resulting sheets are leached in aqueous salt or sodium sulfate solution to remove the 1-methyl-2-pyrrolidinone and to replace toluene sulfonate anions with chloride or sulfate ions. Alternatively the 1-methyl-2-pyrrolidinone can be replaced with water and the toluene sulfonate anions exchanged with inorganic anions by electrodialysis thereby facilitating recycle. The anion exchange membranes resulting from either procedure are useful in the electrodialytic production of potable water from brackish water.

This example illustrates the use of an ionomer or polymerizable electrolyte (vinyl benzyl trimethyl ammonium salt) in the form of its Mc Kee salt (vinyl benzyl trimethyl ammonium toluene sulfonate).

Similar results are obtained when the vinylbenzyl trimethyl ammonium toluene sulfonate is replaced with a chemically equivalent amount ot vinyl benzyl trimethyl ammonium n-octyl sulfate, vinyl benzyl trimethyl ammonium 1-(and/or 2-) methyl-3-oxa pentyl sulfate. vinyl benzyl sulfonate or N-vinyl benzyl-N,N-dimethyl-N-2-ethanol ammonium paratoluene sulfonate. As in Example 2 the process is environmentally friendly and does not present a substantial waste handling problem.

EXAMPLE 7

The apparatus of Example 1 is used. The substrate is a fabric woven from acrylic staple fiber. About 150 kg of solution are prepared containing about:

| | |
|---|---|
| vinyl benzyl trimethyl ammonium chloride | 66.5 kg |
| divinyl benzene, commercial, 76% | 15.4 kg |
| 1,2-propylene glycol | 67.3 kg |
| 2-azo-bis-isobutyronitrile | 0.5 kg |

The solution comprises at least in part components reactable to form polymer and has a viscosity of less than about 10 poise at shear rates in excess of about 1 cm/sec. It is thoroughly deoxygenated. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut by shear 22 into lengths of about 40 inches each. The resulting sheets are leached in water to remove the propylene glycol. The anion exchange membranes resulting from the above procedure are useful in the electrodialysis of brackish water to form potable water.

Similar results are obtained when the 1,2-propylene glycol is replaced with 1,3-propylene glycol, gamma-butyrolactose, propylene carbonate or sulfolane. Propylene glycol, gamma-butyrolactone, propylene carbonate and sulfolane have boiling points in excess of 150° C., low orders of toxicity and are biodegradable. Hence the process is environmentally friendly and does not present a substantial waste handling problem.

EXAMPLE 8

The apparatus of Example 1 is used. The substrate is a fabric woven from acrylic staple fiber. About 150 liters of solution are prepared containing about:

| | |
|---|---|
| dimethyl amino propyl methacrylamide | 55 liters |
| demineralized water | 37 liters |
| vinyl benzyl chloride | 42 liters |
| 1-methyl-2-pyrrolidinone | 16 liters |
| 4-methoxy phenol | 0.4 kg |
| 2,2' azobis (2-methyl butyronitrile) | 1.5 kg |

The solution comprises at least in part components reactable to form polymer and has a viscosity of less than about 10 poise at shear rates in excess of about 1 cm/sec. It is thoroughly deoxygenated. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut into lengths of about 40 inches each by shear 22. The resulting sheets are leached in water to remove the 1-methyl-2-pyrrolidinone. The anion exchange membranes resulting from the above procedure are useful in the electrodialysis of brackish water to form potable water. The process is environmentally friendly and does not present a substantial waste handling problem.

The example illustrates a process in which the ion exchange groups are formed during polymerization, in this case by the reaction of vinyl benzyl chloride moieties with dimethyl amino propyl methacrylamide moieties.

EXAMPLE 9

The apparatus of Example 1 is used. The substrate is a fabric woven from acrylic staple fiber. A solution is prepared containing about:

| | |
|---|---|
| methacrylamidopropyl trimethyl ammonium chloride, 80% in water | 42.5 kg |
| ethylene glycol dimethacrylate | 37 kg |
| dipropylene glycol | 53.7 kg |
| 2,2' azo bis(2-methyl butyronitrile) | 0.5 kg |

The resulting liquid is thoroughly deoxygenated. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut into lengths of about 40 inches each by shear 22.

The resulting sheets are leached in water to remove the dipropylene glycol. The resulting anion exchange membranes are useful in the electrodialytic production of potable water from brackish water.

Similar results are obtained when the ethylene glycol dimethacrylate is replaced in whole or part with an equivalent amount of one or more of: bisphenol-A-diacrylate; bisphenol-A-dimethacrylate; 1,3 butane diol diacrylate; 1,4 butane diol diacrylate; 1,3 butane diol dimethacrylate; 1,4 butane diol dimethacrylate; 1,4 cyclohexanediol dimethacrylate; diethylene glycol diacrylate; diethylene glycol dimethacrylate; 2,2 dimethyl propane diol dimethacrylate; paraphenylene diacrylate; N,N' dimethylene bis acrylamide; N,N' methylene bis acrylamide or N,N' methylene bis methacrylamide.

EXAMPLE 10

The apparatus of Example 1 is used. The substrate is a fabric woven from polypropylene staple fiber. A solution is prepared from:

| | |
|---|---|
| 2-methyl-2-[(1-oxo-2-propenyl)amino]-1-propane sulfonic acid(MOPAPS) | 54.8 kg |
| methacrylic acid | 2.5 kg |
| paramethoxy phenol | 12.3 grams |
| 1-methyl-2-pyrrolidinone | 62 liters |
| demineralized water | 62 liters |
| ethylene glycol dimethacrylate | 55.4 liters |
| tertiary butyl peroctoate | 1.7 kg |
| 1,1' azobis(cyanocyclohexane) | 0.9 kg |

The solution is thoroughly deoxygenated. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut by shear 22 into lengths of about 40 inches each. The resulting sheets are leached in dilute aqueous sodium bicarbonate solution to remove the 1-methyl-2 pyrrolidinone and to convert the membrane to the sodium form. The resulting cation exchange membranes are useful in the electrodialytic production of potable water from brackish water. It is found that with cation exchange membranes according to this example that the pH of the concentrate stream from such electrodialytic production is slightly smaller than when the methacrylic acid is omitted. It is found that 30 percent or even more of the 2-methyl-2-[(1-oxo-2 propenyl) amino]-1-propane sulfonic acid can be replaced with an equivalent amount of methacrylic and/or acrylic acid.

EXAMPLE 11

The apparatus of Example 1 is used. The substrate is a fabric woven from acrylic staple fiber. A solution A is prepared containing:

| | |
|---|---|
| N-methyl-2-methyl-5-vinyl pyridinium methosulfate | 61 kg |
| 1-methyl-2-pyrrolidinone | 62.5 kg |

The solution is warmed to 40° C. and thoroughly deaerated. 32.5 kg of 80% divinyl benzene of commerce is warmed to 40° C. and thoroughly deaerated. Solution A and the divinyl benzene are blended in an in-line mixer at a rate of about 3.8 parts of solution A to 1 part of divinyl benzene and fed immediately through conduit 14 into the apparatus. The linear velocity of the apparatus is adjusted to give a polymerization time of about 25 minutes. Elements 16i through n are heated electrically to cause the temperature of sandwich S to increase from about 70° C. at element 16i to about 100° C. at element 16n. The polymer sheet is cut by shear 22 into lengths of about 40 inches each. The resulting sheets are leached in salt water or aqueous sodium sulfate to remove the 1-methyl-2-pyrrolidinone and replace methosulfate anions with inorganic anions. The resulting anion exchange membranes are useful for the demineralization of brackish water by electrodialysis. This example illustrates the use of the apparatus and processes of the invention for preparing ion exchange membranes in which no polymerization initiator is required. Similar results are obtained when the divinyl benzene is replaced in whole or in part with an equivalent amount of ethylene glycol dimethacrylate or other crosslinker recited in Example 9 and/or when the N-methyl 2-methyl-5-vinyl pyridinium methosulfate is replaced in whole or in part with an equivalent amount of one or more of the following:

N-ethyl-2-methyl-5-vinyl pyridinium ethosulfate
N-methyl-2-methyl-5-vinyl pyridinium toluene sulfate
N-methyl-2-methyl-5-vinyl pyridinum benzene sulfonate
N-methyl-2-methyl-5-vinyl pyridinium chloride
or the alkyl sulfate, toluene sulfonate, benzene sulfonate or halide salts of N-alkyl 2-vinyl and/or 4-vinyl pyridinium.

EXAMPLE 12

The apparatus of Example 1 is used. The substrate is a fabric woven from acrylic staple fiber. A solution is prepared containing:

| | |
|---|---|
| benzyl trimethyl ammonium styrene sulfonate | 66 kg |
| divinyl benzene (80% of commerce) | 20 kg |
| 1-methyl-2-pyrrolidinone | 54 kg |
| demineralized water | 6 kg |
| 2-azo-bis(isobutyronitrile) | 0.5 Kg |

The solution comprises at least in part components reactable to form polymer and has a viscosity of less than about 10 poise at shear rates in excess of about 1 cm/sec. It is thoroughly deoxygenated. The linear velocity of the apparatus is adjusted to give a polymerization time of about 25 minutes. Elements 16$i$ through $n$ are heated electrically to cause the temperature of sandwich S to increase from about 70° C. at element 16$i$ to about 100° C. at element 16$n$. The polymer sheet is cut by shear 22 into lengths of about 40 inches each. The resulting sheets are leached in aqueous magnesium sulfate or chloride solution to remove the 1-methyl-2-pyrrolidinone and to replace benzyl trimethyl ammonium cations with magnesium ions. The resulting cation exchange membranes are useful in the electrodialytic production of potable water from brackish water.

Similar results are obtained when the divinyl benzene is replaced in part or in whole with an equivalent amount of ethylene glycol dimethacrylate or other crosslinker recited in Example 9 and/or the benzyl trimethyl ammonium styrene sulfonate is replaced in whole or in part with an equivalent amount of tetraethyl ammonium styrene sulfonate.

In the above examples inert leachable diluents other than water included 1-methyl-2-pyrrolidinone, dipropylene glycol, 1,-2-propylene glycol, 1,3 propylene glycol, gamma-butyrolactone, propylene carbonate and sulfolane. Other such diluents may be used e.g. dimethyl sulfoxide, formamide, 1,3 butane diol, glycerin, 1,2,3-butane triol, 1,2,6-hexane triol or 1,2,4-butane triol. An appropriate diluent should be substantially leachable, a solvent for the components-reactable-to-solid-polymers, generally a swelling agent for such solid polymers (unless reticulated ion exchange membranes are desired), a poor swelling agent or solvent for the foils and substrates under the temperature-time conditions existing during manufacture. The combination of foils, substrate(s) and liquid comprising in part components reactable to solid polymer (including any polymerization initiators or catalysts) may be regarded as an interacting system. Thus in addition to the requirement that the foils and substrate(s) not be substantially swollen by the liquid under process conditions the liquid during polymerization should not at any point during the process exert a vapor pressure equal to or greater than atmospheric pressure at the site. Further the liquid may contain wetting agents (such as salts of alkylarene sulfonic acids) to assist penetration of the liquid into the foramina of the substrate(s) or such substrate may be pretreated with such wetting agents. The liquid may as well contain viscosity controlling agents to assist retention of said liquid by the sandwich of foils and substrate(s) under gravitational and other stresses. Particularly useful are thixotropic agents which produce viscosities of less than about 10 poise at shear rates in excess of about 1 cm/sec and higher viscosities at lower shear rates. Some additives tend to give other desirable properties to the finished polymer sheets e.g. linear polymers result in polymer sheets which are tougher and less brittle.

In this specification and the appended claims continuous is not meant to imply that the apparatus and/or process operates without cessation or interruption but rather that the time of operation is long with respect to time of polymerization of a given moiety of liquid in the apparatus. The word quasi-continuous is used herein to imply such latter sense. It will be obvious that the apparatus and process may be shut down to change the various rolls 10$a$, 11$a$, 11'$a$, 20$a$ and 20'$a$ or toward the end of a shift or at the end of a planned production run without departing from the spirit of the invention.

It will be understood that the embodiments described herein are merely exemplary and that a person skilled in the art may make many variations and modifications without departing from the spirit and scope of the invention. All such modifications and variations are intended to be included within the scope of the invention as defined in the appended claims.

We claim:

1. A process for manufacturing supported ion exchange membranes from: (I) a liquid characterized by having a viscosity less than about 10 poise at shear rates in excess of about 1 cm/sec and containing at least in part components polymerizable into said membranes and comprising no nonpolymerizable solvents other than water which have a boiling point of less than about 185° C.; and from: (II) at least one quasi-continuous, pliable, support substrate having a multiplicity of apertures extending through said substrate from one face thereof to the other; said process comprising:
   (a) forming a quasi-continuous sandwich comprising said support substrate or a pack of facially continguous support substrates and juxtaposed to each face of said substrate or pack, pliable foil extending beyond the lateral edges of said support substrate or pack, said foil characterized by not being substantially swollen by nor substantially permeable to said liquid at temperatures and times pertaining during said manufacturing;
   (b) maintaining the average plane of said sandwich within an angle of not more than about 45 degrees from the vertical direction;
   (c) passing said sandwich between a pair of substantially horizontal, rotatable squeeze rolls;
   (d) jioning the juxtaposed lateral edges of said pliable foil extending beyond the lateral edges of said support substrate or pack before passing through said squeeze rolls, thereby forming a pocket in said sandwich bounded on the bottom thereof by said squeeze rolls;
   (e) controlling the aperture between said squeeze rolls to approximately the thickness of the sum of the nominal thickness of said foils and support substrate or pack of support substrates;
   (f) introducing said liquid into said pocket to form a laterally extending shallow pool of said liquid on at least one side of said support substrate;
   (g) controlling the level of liquid in said pool;
   (h) pulling said sandwich between said squeeze rolls thereby at least partially filling with said liquid substantially all the apertures of said support substrate or pack passing between said rolls;

(i) thereafter causing said components-polymerizable-to-said-membranes to polymerize thereby resulting in the formation of a supported, solid, polymer sheet subsequently separating said supported, solid, polymer sheet from said pliable foil.

2. Process according to claim 1 in which said liquid comprises a non-polymerizable solvent which is substantially soluble in water.

3. Process according to claim 1 in which said liquid comprises a non-polymerizable solvent which is substantially biodegradable.

4. Process according to claim 1 in which said liquid comprises a non-polymerizable solvent which has a low order of toxicity to humans.

5. Process according to claim 1 in which said liquid comprises a solvent selected from the group consisting of 1-methyl-2-pyrrolidinone, formamide, dipropylene glycol, a propylene glycol, dimethyl sulfoxide, a butane diol, propylene carbonate, gamma butyrolactone, sulfolane, glycerin, a butane triol, a hexane triol and mixtures thereof.

6. Process according to claim 1 in which said liquid comprises a polymerizable electrolyte.

7. Process according to claim 1 in which said liquid comprises a polymerizable Mc Kee type salt.

8. Process according to claim 1 in which said liquid comprises at least in part components polymerizable to said membranes selected from the group consisting of vinyl sulfonic acid, styrene sulfonic acid, 2-sulfoethyl methacrylate, 3-sulfopropyl acrylate, 3-sulfopropyl methacrylate, vinyl benzyl trialkyl ammonium hydroxide, methacrylamido-propyl trialkyl ammonium hydroxide, 2-methyl-2-[(1-oxo-2-propenyl)amino]-1-propane sulfonic acid, 2-methyl-2-[(1-oxo-2-methyl-2-propenyl)amino]-1-propane sulfonic acid, methacrylato-ethyl trialkyl ammonium hydroxide, N-alkyl-2-methyl-5-vinyl pyridinium hydroxide, N-alkyl-2-vinyl-pyridinium hydroxide, N-alkyl 4-vinyl pyridinium hydroxide, dialkylamino propyl methacrylate, dialkyl amino ethyl methacrylate, dialkylamino ethyl methacrylate, vinyl benzyl dialkyl sulfonium hydroxide and their salts.

9. Process according to claim 1 in which said liquid comprises a solvent selected from the group consisting of 1-methyl-2-pyrrolidinone, dipropylene glycol, 1,2- or 1,3-propylene glycol, dimethyl sulfoxide, 1,3 butane diol, propylene carbonate, gamma butyrolactone, sulfolane and mixtures thereof; and also comprises one or more components polymerizable to said membranes selected from the group consisting of vinly sulfonic acid, styrene sulfonic acid, 2-sulfoethyl methacrylate, 3-sulfopropyl acrylate, 3-sulfopropyl methacrylate, 2-methyl-2-[(1-oxo-2-propenyl)amino]-1-propane sulfonic acid, 2-methyl-2-[(1-oxo-2-methyl-2-propenyl)amino]-1-propane sulfonic acid, vinyl benzyl trialkyl ammonium hydroxide, methacrylamido-propyl trialkyl ammonium hydroxide, methacrylato-ethyl trailkyl ammonium hydroxide, N-alkyl-4-vinyl pyridinium hydroxide, dialkyl amino propyl methacrylate, dialkyl amino ethyl methacrylate, vinyl benzyl dialkyl sulfonium hydroxide and their salts.

10. Process according to claim 1 further characterized in that substantially no further covalent bonds are formed in said supported, solid, polymer sheet after step (i).

11. A proces for manufactuign supported ion exchange membranes, which process comprises:

(a) forming a quasi-continuous sandwich comprising a pliable, support substrate having a multiplicity of apertures extending through said substrate from one face therof to the other or a pack of such subtrates facially contiguous and, juxtaposed at each face of said substrate or said pack, pliable foil extending beyond the lateral edges of said support substrate or said pack;

(b) maintaining the average plane of said sandwich within an angle of not more than about 45 degrees from the vertical direction;

(c) passing said sandwich between a pair of substantially horizontal squeeze rolls;

(d) joining the juxtaposed lateral edges of said pliable foil which edges extend beyond the lateral edges of said support substrate or said pack, thereby forming a pocket in said sandwich bounded on the bottom thereof by said squeeze rolls and on the edges and sides thereof by said foil;

(e) controlling the aperture between said squeeze rolls to approximately the thickness of the sum of the nominal thickness of said foils and said support substrate or pack of substrates;

(f) introducing into said pocket on at least one side of said support substrate or pack of substrates a lqiud characterized by having a viscosity less than about 10 poise at shear rates in excess of about 1 cm/sec and comprising at least one mono-ethylenic monomer selected from the group consisting of vinyl sulfonic acid, styrene sulfonic acids, 2-sulfoethyl methacrylate, 3-sulfopropyl acrylate, 3-sulfopropyl methacrylate, vinyl benzyl trialkyl ammonium hydroxides, methacrylamido-propyl trialkyl ammonium hydroxides, 2-methyl-2-[(1-oxo-2- propenyl) amino]-1-propane sulfonic acid, methacrylato-ethyl trialkyl ammonium hydroxides, N-alkyl-2-vinyl-pyridinium hydroxides, N-alkyl-4-vinyl pyridinium hydroxides, dialkyl amino propyl methacrylates, dialkyl amino ethyl methacrylates, vinyl benzyl dialkyl sulfonium hydroxides and their salts, said liquid also comprising at least one cross-linkable monomer and further comprising substantially no organic solvent which has a boiling point at standard atmospheric pressure of less than about 185° C. thereby forming a laterally extending shallow pool of said liquid on said at least one side of said support substrate or pack of substrates;

(g) controlling the level of liquid in said pool;

(h) pulling said sandwich between said squeeze rolls thereby causing said pool to contact said substrate or pack of substrates and said liquid at least partially to fill substantanlly all the apertures of said support substrate or pack of said substrates passing between said rolls;

(i) thereafter coploymerizing said at least one mono-ethylenic monomer with said at least one crosslinkable monomer in the liquid in said apertures thereby forming a polymer-containing-substrate between the foils of said sandwich; and (j) subsequently separating said polymer-containing substrate from said foil.

* * * * *